(12) United States Patent
Minami et al.

(10) Patent No.: US 6,723,487 B2
(45) Date of Patent: Apr. 20, 2004

(54) METHOD FOR PRODUCING ARTICLE COATED WITH PATTERNED FILM AND PHOTOSENSITIVE COMPOSITION

(75) Inventors: Tsutomu Minami, 7-1, Oonodai 2-chome, Osakasayama-shi, Osaka 589-0023 (JP); Masahiro Tatsumisago, Sakai (JP); Kiyoharu Tadanaga, Sakai (JP); Atsunori Matsuda, Kawachi Nagano (JP); Mitsuhiro Kawadu, Osaka (JP); Koichiro Nakamura, Osaka (JP); Hiroaki Yamamoto, Osaka (JP)

(73) Assignees: Nippon Sheet Glass Co., Ltd., Osaka (JP); Tsutomu Minami, Osaka (JP)

( * ) Notice: Subject to any disclaimer, the term of this patent is extended or adjusted under 35 U.S.C. 154(b) by 379 days.

(21) Appl. No.: 09/936,323

(22) PCT Filed: Dec. 28, 2000

(86) PCT No.: PCT/JP00/09382

§ 371 (c)(1),
(2), (4) Date: Sep. 12, 2001

(87) PCT Pub. No.: WO01/51992

PCT Pub. Date: Jul. 19, 2001

(65) Prior Publication Data

US 2002/0160298 A1 Oct. 31, 2002

(30) Foreign Application Priority Data

Jan. 11, 2000 (JP) .................................. 2000-002881

(51) Int. Cl.$^7$ ............................................. G03F 7/075
(52) U.S. Cl. ...................... 430/270.1; 430/325; 216/24; 216/26; 216/87
(58) Field of Search ........................... 430/270.1, 325; 216/24, 26, 87

(56) References Cited

U.S. PATENT DOCUMENTS 5,271,797 A    12/1993  Kamisawa
6,183,935 B1 *  2/2001  Hanabata et al. ......... 430/270.1
6,534,235 B1 *  3/2003  Hanabata et al. ........... 430/191
6,632,585 B1 * 10/2003  Nakamura ............... 430/281.1

FOREIGN PATENT DOCUMENTS

| EP | 938027    | 8/1999  |
| EP | 965885    | 12/1999 |
| JP | 6-148880  | 5/1994  |
| JP | 7-305030  | 11/1995 |
| JP | 11-338145 | 12/1999 |

OTHER PUBLICATIONS

Najafi, S.I., et al. "Sol–Gel Glass Waveguide and Grating on Silicon", Journal of Lightwave Technology, vol. 16, No. 9 (1998), pp. 1640–1646.

Touam, T., et al. "Theoretical and experimental study of ridge waveguides with Bragg grating derived from hybrid sol–gel glasses", SPIE, vol. 3282, pp. 17–30.

Andrews, M.P., et al. "Collateral Densification Associated with the Photoresponse of Hybrid Sol–Gel Glasses for Depositing Bragg Gratings on Ridge Waveguides", SPIE, vol. 3282, pp. 50–58.

* cited by examiner

Primary Examiner—Mark F. Huff
Assistant Examiner—Amanda Walke
(74) Attorney, Agent, or Firm—Wenderoth, Lind & Ponack, L.L.P.

(57) ABSTRACT

There can be provided a method for producing a pattern film-coated article which has excellent film formability, can remove unexposed portions of a film completely in the development step after exposing the film to light. and has excellent pattern accuracy; and a photosensitive composition.

The method for producing a pattern film-coated article comprises the steps of coating a photosensitive composition comprising an organometallic or organosilicon compound having photosensitivity and a hydrolyzable metal or silicon alkoxide on a substrate, irradiating the coated film on the substrate with light to polymerize the exposed portions of the coated film and then dissolving unexposed portions to remove them, wherein a pattern film-coated article is produced from an allyl group-containing metal or silicon alkoxide as the organometallic or organosilicon compound.

106 Claims, No Drawings

METHOD FOR PRODUCING ARTICLE COATED WITH PATTERNED FILM AND PHOTOSENSITIVE COMPOSITION

This application is a 371 application of PCT/JP00/09382 filed Dec. 28, 2000.

TECHNICAL FIELD

The present invention relates to a method for producing a pattern film-coated article, particularly, a method for producing a pattern film-coated article which comprises the steps of coating a photosensitive composition containing an organometallic compound having photosensitivity on a substrate, irradiating the coated composition with light to polymerize and cure the coated film and removing unexposed portions, and to a photosensitive composition.

BACKGROUND ART

The development of a photosensitive material for forming a pattern film has heretofore been under way, and a number of proposals associated with such a material have been made. In general, the properties required for the photosensitive material are, for example, (1) having high sensitivity to irradiated energy, (2) having high resolution, that is, having excellent pattern accuracy and processability and (3) having high adhesion to a substrate. It has heretofore been attempted to form a thin-film pattern of an oxide of a metal element and an amphoteric element by using a sol-gel material having photosensitivity.

The production of an optical waveguide element having a grating by exposure and development (leaching) using a photosensitive material comprising methacryloxypropyltrimethoxysilane, zirconium alkoxide and acrylic acid is described in JOURNAL OF LIGHTWAVE TECHNOLOGY, VOL. 16, No. 9, pp. 1,640 to 1,646, SEPTEMBER, 1998, SPIE Vol. 3,282, pp. 17 to 30, and SPIE Vol. 3,282, pp. 50 to 58.

In the case of the above method, however, it is difficult to fully remove unexposed portions of the film during development after exposure, so that a good pattern cannot be obtained. Therefore, there are such problems that a waveguide laser beam leaks in the production of a waveguide and that a distinct pattern of diffracted lights cannot be obtained and the diffracted light beams are blurred or merged in the production of a diffraction grating.

DISCLOSURE OF THE INVENTION

It is therefore the object of the present invention to provide a method for producing a pattern film-coated article which has excellent film formability, can remove unexposed portions of a film completely in the development step after exposing the film to light (or has so-called "good leaching") and has excellent pattern accuracy; and a photosensitive composition for producing the article.

According to the present invention, firstly, the above object and advantage of the present invention can be achieved by a method for producing a pattern film-coated article which comprises the steps of coating a photosensitive composition containing an organometallic or organosilicon compound having photosensitivity and a hydrolyzable metal or silicon alkoxide on a substrate, irradiating the coated film on the substrate with light to polymerize the exposed portions of the coated film and then dissolving its unexposed portions of the coated film to remove them, wherein the above organometallic or organosilicon compound is an allyl group-containing metal or silicon alkoxide.

According to the present invention, secondly, the above object and advantage of the present invention can be achieved by a method for producing a pattern film-coated article which comprises the steps of coating a photosensitive composition containing an allyl group-containing trialkoxysilane on a substrate, irradiating the coated film on the substrate with light to polymerize the exposed portions of the coated film and then dissolving its unexposed portions of the coated film to remove them.

According to the present invention, thirdly, the above object and advantage of the present invention can be achieved by a photosensitive composition comprising an allyl group-containing metal or silicon alkoxide, a photoreaction initiator, a polymerization promoter and water as main components.

PREFERRED EMBODIMENT OF THE INVENTION

Illustrative examples of the allyl group-containing metal or silicon alkoxide which has photosensitivity and which is used in the photosensitive composition of the present invention include an allyl group-containing silicon alkoxide, an allyl group-containing titanium alkoxide, an allyl group-containing zirconium alkoxide and an allyl group-containing aluminum alkoxide. Of these, the allyl group-containing silicon alkoxide is preferably used. As the allyl group-containing silicon alkoxide (to be sometimes referred to simply as "allylsilane"hereinafter), allyl group-containing trialkoxysilanes such as allyltrimethoxysilane and allyltriethoxysilane; diallyldialkoxysilanes such as diallyldimethoxysilane and diallyldiethoxysilane; allylaminotrimethoxysilane; and chloroallylsilanes such as allyltrichlorosilane and diallyldichlorosilane are used. Of these, allyltrimethoxysilane and allyltriethoxysilane are particularly preferably used. Attention must be paid to the working environment under which chloroallylsilanes are used since they produce a hydrogen chloride gas at the time of reaction.

The content of the above allyl group-containing metal or silicon alkoxide having photosensitivity in the above photosensitive composition is preferably 5 to 95.49% by weight.

Illustrative examples of the hydrolyzable metal or silicon alkoxide used in the photosensitive composition of the present invention include a silicon alkoxide, a titanium alkoxide, a zirconium alkoxide and an aluminum alkoxide. Of these, a silicon tetra- or tri-alkoxide, a titanium tetra- or tri-alkoxide, a zirconium tetra- or tri-alkoxide, and an aluminum trialkoxide are preferably used. Illustrative examples of the above tetraalkoxides and aluminum trialkoxide include tetraethoxysilane, tetramethoxysilane, tributoxyaluminum, tetrapropoxyzirconium, tetrabutoxyzirconium, tetraisopropoxytitanium and tetrabutoxytitanium.

Illustrative examples of the silicon trialkoxide, titanium trialkoxide and zirconium trialkoxide include methyltriethoxysilane, methyltrimethoxysilane, phenyltriethoxysilane, phenyltrimethoxysilane, 3-methacryloxyalkyltrialkoxysilane, vinyltrimethoxysilane, vinyltriethoxysilane, 3-acryloxypropyltrimethoxysilane, 3-(N-allylamino)propyltrimethoxysilane, (2-cyclohexenyl-2-ethyl)trialkoxysilane, 5-(bicycloheptenyl)trialkoxysilane, (acryloxymethyl)phenethyltrialkoxysilane, 1,1-bis(trialkoxysilylmethyl)ethylene, bis(triethoxysilyl)ethylene, bis(triethoxysilyl)-1,7-octanediene, butenyltriethoxysilane, (3-cyclopentadienylpropyl)triethoxysilane, 5-hexenyltrialkoxysilane, O-(methacryloxyethyl)-N-

(triethoxysilylpropyl)urethane, 1,7-octadienyltriethoxysilane, 7-octenyltrialkoxysilane, (2,4-pentadienyl)trialkoxysilane, styrylethyltrimethoxysilane, vinyltriisopropenoxysilane; titanium allylacetoacetate triisopropoxide, titanium methacrylate triisopropoxide, titanium methacryloxyethylacetoacetate triisopropoxide, (2-methacryloxyethoxy)triisopropoxytitanate; and zirconium methacryloxyethylacetoacetate triisopropoxide.

Further, an alkoxide of metal and silicon such as di-s-butoxyaluminoxytriethoxysilane and an alkoxide of different types of metals are also used. The hydrolyzable metal or silicon tetraalkoxide may be an oligomer (for example, oligomer having an average degree of polymerization of not higher than 5) and may be partially or wholly hydrolyzed. However, when the content of the hydrolyzable metal or silicon tetraalkoxide is expressed in mol % or wt %, the content of its monomer or the material before hydrolysis is expressed.

These hydrolyzable metal or silicon alkoxides may be chelated by such ligands as β-diketone, e.g., acetylacetone, methylacetylacetone, ethylacetylacetone and diethylacetylacetone, as required. Acetylacetone aluminum and titanium acetylacetonate also serve as a polymerization promoter to be described later.

Of these hydrolyzable metal or silicon alkoxides, tetraethoxysilane, tetramethoxysilane and tetrabutoxy zirconium are particularly preferably used. For example, the hardness of the film can be further increased by using tetrabutoxy zirconium. Further, by using the zirconium alkoxide and/or the titanium alkoxide, the refractive index of the film can be increased to a desired value.

By incorporating the above hydrolyzable metal or silicon alkoxides into the photosensitive composition of the present invention, a film having a strong network can be formed and the chemical resistance and weather resistance of the film can be improved. When the amount of these hydrolyzable metal or silicon alkoxldes is too large, the amount of the above allyl group-containing metal or silicon alkoxides decreases accordingly. Therefore, the amount of the hydrolyzable metal or silicon alkoxides is preferably 1 to 50% by weight, more preferably 5to 40% by weight, in relation to the allylsilanes. The content of the above hydrolyzable metal or silicon alkoxides in the photosensitive composition is preferably 1 to 50% by weight. When an allyltrialkoxysilane such as allyltrimethoxysilane or allyltriethoxysilane is used as the allylsilane in the present invention, the above hydrolyzable metal or silicon alkoxides may not have to be contained in the photosensitive composition. When the hydrolyzable metal or silicon alkoxides are not contained, the content of the above allyl group-containing metal or silicon alkoxides in the above photosensitive composition is preferably not higher than 96.49% by weight. However, when it is desired to further increase the strength, chemical resistance and weather resistance of the film, it is preferable to add the above hydrolyzable metal or silicon alkoxides.

The photosensitive composition in the present invention contains water used for hydrolyzing the above hydrolyzable metal or silicon alkoxides and the above allyl group-containing metal or silicon alkoxides having photosensitivity and, as required, a catalyst which are for promoting the above hydrolysis, a photoreaction initiator, a polymerization promoter and a solvent. The content of water including the water contained in the aqueous solution of the catalyst is 0.8 to 30 times as much as the required stoichiometric ratio and is preferably 1 to 20 times, more preferably 2 to 10 times, as much as the total of the above hydrolyzable metal or silicon alkoxides and the above allyl group-containing metal or silicon alkoxides having photosensitivity in terms of molar ratio. The content of water in the photosensitive composition is preferably 3 to 50% by weight, more preferably 5 to 30% by weight. However, when the above hydrolyzable metal or silicon alkoxides and the above allyl group-containing metal or silicon alkoxides having photosensitivity are already partially or wholly hydrolyzed, the water content may be zero or lower than the above range.

The above catalyst is a component which is preferable to be contained. As the catalyst, inorganic acids such as hydrochloric acid, nitric acid ($HNO_3$) and sulfuric acid and organic acids such as acetic acid, oxalic acid, formic acid, propionic acid and p-toluenesulfonic acid are used. The content of the catalyst varies depending on the type of the acid and the strength (weak acid or strong acid) as a protonic acid. When the content of the catalyst is too low, the hydrolysis and dehydration condensation reaction proceeds slowly, while when it is too high, the condensation reaction proceeds excessively and the molecular weight becomes too large, whereby a precipitate is liable to be formed disadvantageously, or a coating solution is liable to be gelled disadvantageously. Therefore, when hydrochloric acid is used as the acid catalyst, the content of the acid catalyst to be added is preferably 0.01 to 100 millimoles (0.00001 to 0.1 mole), more preferably 0.05 to 50 millimoles per mole of the total of the above hydrolyzable metal or silicon alkoxides and the above allyl group-containing metal or silicon alkoxides having photosensitivity in terms of molar ratio. The content of the acid catalyst in the photosensitive composition is preferably 0.00002 to 10% by weight, more preferably 0.0001 to 1% by weight. However, when the above hydrolyzable metal or silicon alkoxides and the above allyl group-containing metal or silicon alkoxides having photosensitivity are already partially or wholly hydrolyzed, the content of the acid catalyst may be zero or lower than the above range.

The photoreaction initiator used in the photosensitive composition of the present invention is a component which is preferable to be contained and initiates and promotes photopolymerization when the allyl group having a polymerizable carbon-carbon double bond in the above allyl group-containing metal or silicon alkoxide having photosensitivity is irradiated with light. As the initiator, benzophenone, acetophenone, benzoin isopropyl ether, benzoin isobutyl ether, benzoyl peroxide, 1-hydroxycyclohexyl-1-phenylketone (Ciba-GeigyCorporation, "Irgacure 184"), 2-hydroxy-2-methyl-1-phenylpropane-1-one (Merck & Co., Inc., "Dalocure 1173"), 1-(4-isopropylphenyl)-2-hydroxy-2-methylpropane-1-one (Merck & Co., Inc., "Dalocure 1116"), 2,2-dimethoxy-2-phenylacetophenone (Ciba-GeigyCorporation, "Irgacure 651") and the like are suitably used. The content of the photoreaction initiator is preferably 0.001 to 0.2 moles per mole of the allyl group-containing metal or silicon alkoxide. Further, the content of the photoreaction initiator in the photosensitive composition is preferably 1 to 20% by weight, more preferably 0.5 to 10% by weight.

The polymerization promoter used in the present invention is a component that is preferable to be contained and serves as a polymerization-promoting catalyst when the above metal or silicon alkoxide and the above allyl group-containing metal or silicon alkoxide are hydrolyzed and then polycondensed to form an Si—O—Si bond. As the polymerization promoter, organic amines such as triethylamine and n-butylamine; metal acetylacetonatos such as acetylacetone aluminum which is chelated by acetylacetone, titanium acetylacetonato and chromium acetylacetonato; and tin compounds such as octyl tin and stannic chloride are suitably used. The content of the polymerization promoter is preferably 0.0005 to 0.1 moles per mole of the total of the above metal or silicon alkoxide and the above allyl group-containing metal or silicon alkoxide in terms of molar ratio. The content of the polymerization promoter in the photosensitive composition is preferably 0.01 to 10% by weight, more preferably 0.05 to 10% by weight.

An organic solvent which is the solvent used in the present invention is a component that is preferable to be contained. There is a case where the solvent may not have to be intentionally added since an alcohol produced when the above metal or silicon alkoxide and the above allyl group-containing metal or silicon alkoxide are hydrolyzed serves as the solvent. In general, however, a suitable solvent is used according to the type of method for forming the coated film. As the method for forming the coated film, casting, dip coating, gravure coating, flexographic printing, roller coating or the like is suitably used. Of these, the organic solvent used in casting or dip coating is suitably a solvent having a fast evaporation rate. That is, when the evaporation rate of the solvent is too slow, the flowability of the solution becomes high since the coated film is too slow to be dried, whereby a coated film having a uniform thickness may not be obtained. Therefore, alcohol solvents having a fast evaporation rate such as methanol, ethanol, isopropyl alcohol and tert-butoxy alcohol can be suitably used.

On the other hand, the organic solvent used in gravure coating, flexographic printing or roller coating is suitably a solvent having an extremely slow evaporation rate as will be described below. This is because when a solvent having an excessively fast evaporation rate is used, the solvent evaporates before sufficient leveling is done, thereby giving a poor appearance to the coated film. The evaporation rate of the solvent is generally evaluated by a relative evaporation rate index with the evaporation rate of butyl acetate being 100. A solvent having a relative evaporation rate index of not larger than 40 is classified as a solvent having an extremely slow evaporation rate, and such a solvent is preferable as an organic solvent to be used in gravure coating, flexographic printing or roller coating. Illustrative examples of such an organic solvent include ethyl cellosolve, butyl cellosolve, cellosolve acetate, diethylene glycol monoethyl ether, hexylene glycol, diethylene glycol, ethylene glycol, tripropylene glycol, diacetone alcohol and tetrahydrofurfuryl alcohol.

Although it is desirable to use one of the above solvents as the solvent of the coating solution used in the present invention, a mixture of the above solvents may also be used according to the characteristics of the coating method and the coating solution.

The content of the solvent is preferably 0.3 to 5 times, more preferably 0.5 to 3 times as much as the total of the above metal or silicon alkoxide and the above allyl group-containing metal or silicon alkoxide in terms of molar ratio. The content of the solvent in the photosensitive composition is preferably 0 to 50% by weight, more preferably 0 to 20% by weight.

A variety of additives may be added to the photosensitive composition of the present invention. Illustrative examples of such additives include a film thickness-increasing agent which increases the film thickness, viscosity-increasing agent, leveling agent and flow-controlling agent. Specific examples thereof include silicones such as dimethylpolysiloxane and glycols such as polyethylene glycol.

Since the photosensitive composition of the present invention must be eventually irradiated with light to form a pattern, the siloxane polymer must be dissolved in an organic solvent or an alkali aqueous solution from the viewpoint of pattern formability. Therefore, care must be taken on the hydrolysis conditions since leaching becomes difficult to carry out when the degrees of polymerization of the above metal or silicon alkoxide and the above allyl group-containing metal or silicon alkoxide are raised too high. The photosensitive composition comprising the allyl group-containing metal or silicon alkoxide, the hydrolyzable metal or silicon alkoxide, and, as required, the hydrolysis catalyst, the photoreaction initiator, the polymerization promoter, water and the solvent is preferably prepared by mixing these components together and then allowing the mixture to react at room temperature to 50° C. for 30 minutes to 12 hours to hydrolyze the mixture.

The photosensitive composition of the present invention preferably contains 5 to 95.49% by weight of the allyl group-containing metal or silicon alkoxide, 1 to 50% by weight of the hydrolyzable metal or silicon alkoxide, 0.5 to 10% by weight of the photoreaction initiator, 0.01 to 10% by weight of the polymerization promoter, 0 to 50% by weight of the solvent and 3 to 50% by weight of water.

Further, the photosensitive composition of the present invention preferably contains 5 to 96.49% by weight of the allyl group-containing trialkoxysilane, 0.5 to 10% by weight of the photoreaction initiator, 0.01 to 10% by weight of the polymerization promoter, 0 to 50% by weight of the solvent and 3 to 50% by weight of water.

The substrate used in the present invention may take any form such as a flat plate, curved plate or stick. The substrate desirably has a small amount of surface warpage (heat distortion length in the direction perpendicular to the surface direction of the substrate per unit length in the surface direction of the substrate). When the amount of warpage is larger than this range, the coated film may be peeled off from the substrate or cracked in the process of forming the film. Therefore, it is preferable to be selective in selecting the material, size and form of the substrate.

Further, this substrate preferably has a linear expansion coefficient of not higher than $5 \times 10^{-5}/°$ C. This is because when the linear expansion coefficient of a substrate made of plastic having a high linear expansion coefficient such as polypropylene ($9 \times 10^{-5}$ to $15 \times 10^{-5}/°$ C.) is higher than $5 \times 10^{-5}/°$ C., for example, an organopolysiloxane film is peeled off from the substrate or cracked in the process of forming the film. Ordinary inorganic glass has a linear expansion coefficient of not higher than $5 \times 10^{-5}/°$ C. Further, at least the surface of the substrate is preferably comprised of an oxide. This is because when the surface of the substrate which makes contact with the film is not comprised of an oxide, the adhesion strength lowers in the process of forming the film and, in some cases, the film is peeled off from the substrate. Illustrative examples of preferable substrate materials include oxide glass such as silicate glass, borate glass and phosphate glass; quartz, ceramic, metal, silicon, epoxy resins and fibrous glass reinforced polystyrene. A metal cannot be bonded to the film as it is but can be used as the substrate once the surface thereof is treated with an oxide in advance. Of these, float glass (linear expansion coefficient: $1 \times 10^{-5}/°$ C.) is preferable from the viewpoint of cost, and quarts glass (linear expansion coefficient: $8 \times 10^{-7}/°$ C.) and zero expansion glass (linear expansion coefficient: $-3 \times 10^{-7}$ to $0.0 \times 10^{-7}/°$ C., trade name: Neoceram, Zeroduaglass) are the most preferable from the viewpoint of thermal expansion coefficient. Further, when an integrated optical element is to be produced, a silicon substrate (linear expansion coefficient: 41.5×10⁻⁷/° C.) may be used.

The above photosensitive composition is coated on a substrate having a predetermined shape to a wet thickness of 0.5 to 200 μm to form a coated film, a photomask having a pattern comprising light-transmitting and light-shielding areas having predetermined shapes is placed on the coated film, ultraviolet radiation is irradiated to the coated film via the photomask for 1 seconds to 30 minutes in such a manner that, for example, the light intensity at the irradiated position should be 1 to 200 mW/cm² to polymerize the exposed portion of the coated film which corresponds to the light-transmitting area of the photomask, the unexposed portion of the coated film which corresponds to the light-shielding area of the photomask is leached (dissolved and removed) by alcohol or an alkali aqueous solution, and the resulting substrate is heated preferably at 80 to 350° C. for 10 minutes to 5 hours to cure the coated film, thereby forming an article coated with a pattern film which has a thickness of 100 nm to 50 μm, particularly preferably 100 nm to 10 μm and a shape corresponding to the light-transmitting area pattern of the above photomask, as exemplified by an optical waveguide element, a diffraction grating or other optical element. By the above light irradiation, the photopolymerization (the polymerizable carbon-carbon double bonds of the allyl groups are opened and bonded to others) of the allyl group-containing metal or silicon alkoxides does not occur in the unexposed portion of the coated film, and the allyl group-containing metal or silicon alkoxides are dissolved and removed by solvent together with a hydrolysate of the hydrolyzable metal or silicon alkoxides. The allyl group-containing metal or silicon alkoxides in the exposed portion of the coated film are polymerized by the opening and rebonding of the polymerizable carbon-carbon double bonds contained therein, thereby becoming insoluble to the solvent. Then, by the subsequent heat treatment, the hydrolysis and dehydration condensation reaction of the allyl group-containing metal or silicon alkoxides and hydrolyzable metal or silicon alkoxides in the exposed portion of the coated film is completed and the remaining coated film is cured.

As described above, the photosensitive composition of the present invention is used for the production of a pattern film-coated article in which a portion of a coated film is polymerized and cured by irradiation of light and the unexposed portion of the film is dissolved and removed. In addition, an optical element, such as a microlens, diffraction grating or optical waveguide, or other coated article which has a film having the surface pattern of a shape transferred thereon bonded to a substrate can be produced by placing the photosensitive composition between the substrate and the shape whose surface may take a variety of patterns, pressing them as required, irradiating the whole substrate with light to polymerize and cure the coated photosensitive composition.

EXAMPLES

The present invention will be described in detail hereinafter.

Example 1

Preparation of Photosensitive Composition 3.39 Grams of ethyl acetoacetate was added to 7.67 g of zirconium tetrabutoxide, and the resulting solution was stirred for 0.5 hours. Then, 12.9 g of allyltriethoxysilane was added to the solution, and the resulting solution was stirred for 0.5 hours. Thereafter, 3.6 g of a 0.06-wt % $HNO_3$ aqueous solution was added to the solution, and the resulting solution was stirred for three hours until it became homogeneous. Then, 0.80 g of benzoin isobutyl ether as a photoreaction initiator and 0.032 g of acetylacetone aluminum as a polymerization promoter were added to the homogenous solution, and the resulting solution was stirred for another 2 hours to prepare a photosensitive composition.

A quartz substrate (refractive index: 1.46) having a thickness of 0.5 mm and a size of 2 cm×2 cm was subjected to ultrasonic cleaning in isopropyl alcohol for 20 minutes and then in pure water for another 20 minutes. On the substrate, the above photosensitive composition was dropped and spin-coated to spread the composition over the substrate uniformly. The resulting substrate was heated and dried at 90° C. for 10 minutes. A photomask (having a size of 2 cm×2 cm with two parallel, narrow ultraviolet radiation-transmitting portions spacing 20 μm apart and each having a length of 2 cm and a width of 15 μm at the center, the rest of the photomask blocks ultraviolet radiation) was placed on the surface of the coated film, the substrate was then placed in a nitrogen atmosphere, and an ultraviolet radiation of 5 eV (wavelength: 365 nm) was irradiated onto the substrate from 30 cm above for 10 minutes. The intensity of the ultraviolet radiation on the surface of the film was 10 mW/cm². By the radiation, in the exposed portions (portions corresponding to the above ultraviolet radiation-transmitting portions) of the film, the polymerizable carbon-carbon double bond of the allyl group of allyltriethoxysilane was opened, thereby producing a polymer (insoluble to isopropyl alcohol) of allyltriethoxysilane. However, in the unexposed portions (portions corresponding to the above ultraviolet-blocking portions), such a polymer was not produced, and the unexposed portions had solubility to isopropyl alcohol. After the completion of the exposure, the substrate was immersed and rinsed in isopropyl alcohol, and the unexposed portions of the film were dissolved and removed. The resulting substrate was heated and dried at 150° C. for one hour, whereby the hydrolysis and dehydration polycondensation reaction of allyltriethoxysilane and zirconium tetrabutoxide were completed. As a result, a ridge-type optical waveguide having two parallel waveguide cores (refractive indices: 1.47) each having a width of 15 μm, a height of 12 μm and a length of 2 cm placed on the quartz substrate with a spacing of 20 μm therebetween was obtained. As a result of observation by SEM (scanning electron microscope), no residual unexposed portions were observed between the two waveguide cores on the quartz substrate, and it was understood that the portions unexposed to ultraviolet radiation were leached completely.

Comparative Example 1

A photosensitive composition was prepared in the same molar ratio as used in Example 1 except that 10 g of trimethoxysilylpropylmethacrylate was used in place of 12.9 g of allyltriethoxysilane used in the preparation of the photosensitive composition in the above Example 1.

A ridge-type optical waveguide was obtained by coating the above photosensitive composition on a quartz substrate, drying the coated film, irradiating the dried film with ultraviolet radiation, removing unexposed portions from the film and heating the substrate in the same manner as in Example 1. Each of the waveguide cores (refractive indices: 1.47) had a width of 15 μm and a height of 12 μm. As a result of observation by SEM (scanning electron microscope), it was found that the unexposed portions constituting about 5% of the whole area of the quartz substrate still remained between the two waveguide cores.

Example 2

Preparation of Photosensitive Composition 3.6 Grams of a 0.06-wt % $HNO_3$ aqueous solution was added to 16.2 g of allyltrimethoxysilane, and the resulting solution was stirred for 3 hours until it became homogeneous. Then, 0.8 g of benzoin isobutyl ether as a photoreaction initiator and 0.32 g of acetylacetone aluminum as a polymerization promoter were added to the homogenous solution, and the resulting solution was stirred for another one hour to prepare a photosensitive composition.

A ridge-type optical waveguide was obtained by coating the above photosensitive composition on a quartz substrate, drying the coated film, irradiating the dried film with ultraviolet radiation, removing unexposed portions from the film and heating the substrate in the same manner as in the above Example 1 except that a 5-wt % NaOH aqueous solution was used in place of isopropyl alcohol used for removing the unexposed portions in the above Example 1. Each of the waveguide cores (refractive indices: 1.465) had a width of 15 µm and a height of 13 µm. As a result of observation by SEM (scanning electron microscope), no residual unexposed portions were observed between the two waveguide cores on the quartz substrate.

Example 3

Preparation of Photosensitive Composition

After 8.3 g of tetraethoxysilane was added to 16.2 g of allyltriethoxysilane, 3.6 g of a 0.06-wt % $HNO_3$ aqueous solution was added to the solution, and the resulting solution was stirred for three hours until the solution became homogeneous. Then, 0.08 g of benzoin isobutyl ether as a photoreaction initiator and 0.03 g of acetylacetone aluminum as a polymerization promoter were added to the homogenous solution, and the resulting solution was stirred for another one hour to prepare a photosensitive composition.

A diffraction grating was obtained by coating the above photosensitive composition on a quartz substrate, drying the coated film, irradiating the dried film with ultraviolet radiation, removing unexposed portions from the film and heating the substrate in the same manner as in the above Example 2 except that a photomask (having a size of 2 cm×2 cm with about 1,000 stripe-shaped ultraviolet radiation-transmitting portions each having a width of 10 µm and a length of 2 cm placed parallel to each other at an interval of 10 µm therebetween) was used in place of the photomask used in Example 2. Each projecting portion of the diffraction grating had a width of 10 µm, a length of 2 cm and a height of 10 µm. When the diffraction of the obtained diffraction grating was observed by using a 632.8-nm beam generated from a He—Ne laser, both primary diffracted light and secondary diffracted light were clearly observed. Further, as a result of observation by SEM (scanning electron microscope), no residual unexposed portions were observed among the projecting portions on the diffraction grating on the quartz substrate.

Comparative Example 2

A diffraction grating having almost the same size as that of Example 3 was obtained by coating the photosensitive composition prepared in the above Comparative Example 1 on a quartz substrate, drying the coated film, irradiating the dried film with ultraviolet radiation, removing unexposed portions from the film and heating the substrate in the same manner as in the above Example 3. When the diffraction of the obtained diffraction grating was observed by using a 632.8-nm beam generated from a He—Ne laser, no orderly diffracted lights were observed. Further, as a result of observation by SEM (scanning electron microscope), it was observed that the unexposed portions constituting about 5% of the whole area of the quartz substrate still remained among the projecting portions on the diffraction grating.

Comparative Example 3

3.6 Grams of a 0.06-wt % $HNO_3$ aqueous solution was added to 24.8 g of trimethoxysilylpropylmethacrylate, and the resulting solution was stirred for 3 hours until it became homogeneous. Then, 0.8 g of benzoin isobutyl ether as a photoreaction initiator and 0.32 g of acetylacetone aluminum as a polymerization promoter were added to the homogenous solution, and the resulting solution was stirred for another one hour to prepare a photosensitive composition.

The above photosensitive composition was coated on a quartz substrate by dip coating. However, a smooth coated film was not obtained because the sol on the substrate agglomerates in the form of islands or droplets while blown to be dried.

Comparative Example 4

4.17 Grams of tetraethoxysilane and 3.6 g of a 0.06-wt % $HNO_3$ aqueous solution were added to 19.8 g of trimethoxysilylpropylmethacrylate, and the resulting solution was stirred for 3 hours until the solution became homogeneous. Then, 0.80 g of benzoin isobutyl ether as a photoreaction initiator and 0.32 g of acetylacetone aluminum as a polymerization promoter were added to the homogenous solution, and the resulting solution was stirred for another one hour to prepare a photosensitive composition.

After the above photosensitive composition was coated on a quartz substrate by dip coating, the coated film was irradiated with ultraviolet radiation, unexposed portions were removed from the coated film, and the substrate was heated to prepare a diffraction grating in the same manner as in Example 3. Residual unexposed portions were observed by SEM observation. When diffracted lights were observed by irradiating the sample with a 632.8-nm beam generated from a He—Ne laser, clear diffracted lights were not observed, and the observed lights appeared blurred or were merged.

Comparative Example 5

3.6 Grams of a 0.06-wt % $HNO_3$ aqueous solution was added to 19.3 g of vinyltriethoxysilane, and the resulting solution was stirred for 3 hours until the solution became homogeneous. Then, 0.8 g of benzoin isobutyl ether as a photoreaction initiator and 0.32 g of acetylacetone aluminum as a polymerization promoter were added to the homogenous solution, and the resulting solution was stirred for another one hour to prepare a photosensitive composition.

The above photosensitive composition was coated on a quartz substrate, dried and irradiated with ultraviolet radiation in the same manner as in the above Example 3. When the coated film was rinsed with isopropyl alcohol after irradiated with ultraviolet radiation, not only unexposed portions but also exposed portions were leached, and no polymerization occurred by irradiation of light.

Comparative Example 6

4.17 Grams of tetraethoxysilane and 3.6 g of a 0.06-wt % $HNO_3$ aqueous solution were added to 15.2 g of vinyltriethoxysilane, and the resulting solution was stirred for 3 hours until the solution became homogeneous. Then, 0.80 g of benzoin isobutyl ether as a photoreaction initiator and 0.32 g of acetylacetone aluminum as a polymerization promoter were added to the homogenous solution, and the resulting solution was stirred for another one hour to prepare a photosensitive composition.

After the above photosensitive composition was coated on a quartz substrate by dip coating, the coated film was masked and irradiated with ultraviolet radiation, unexposed portions were removed from the coated film, and the substrate was heated to prepare a diffraction grating in the same manner as in the above Example 3. It was observed by SEM observation that portions other than the exposed portions of the film were also leached, and a clear striped pattern was not obtained. When diffracted lights were observed by irradiating the sample with a 632.8-nm beam generated from a He—Ne laser, clear diffracted lights were not observed, and the observed lights appeared blurred or were merged.

As described above, according to the present invention, by coating a photosensitive composition on a substrate, irradiating the coated film with light through a photomask having a predetermined pattern and leaching unexposed portions with an organic solvent or an alkali aqueous solution, a fine pattern film having distinct interface between exposed and unexposed portions and excellent accuracy can be obtained. Consequently, a pattern film-coated article having high heat resistance, water resistance, chemical resistance and the like and used as an optical element such as an optical waveguide or diffraction grating can be obtained.

What is claimed is:

1. A method for producing a pattern film-coated article which comprises the steps of coating a photosensitive composition comprising an organometallic or organosilicon compound having photosensitivity and a hydrolyzable metal or silicon alkoxide on a substrate, irradiating the coated film on the substrate with light to polymerize the exposed portions of the coated film and then dissolving unexposed portions of the coated film to remove them, wherein the organometallic or organosilicon compound is an allyl group-containing metal or silicon alkoxide.

2. The method of claim 1, wherein the allyl group-containing metal or silicon alkoxide is allyltrimethoxysilane or allyltriethoxysilane.

3. The method of claim 1, wherein the hydrolyzable metal or silicon alkoxide includes a silicon alkoxide, a titanium alkoxide, a zirconium alkoxide or an aluminum alkoxide.

4. The method of claim 1, wherein the hydrolyzable metal or silicon alkoxide includes a silicon tetra- or tri-alkoxide, a titanium tetra- or tri-alkoxide, a zirconium tetra- or tri-alkoxide or an aluminum trialkoxide.

5. The method of claim 1, wherein the hydrolyzable metal or silicon alkoxide includes at least one alkoxide selected from the group consisting of tetraethoxysilane, tetramethoxysilane, tributoxyaluminum, tetrapropoxyzirconium, tetrabutoxyzirconium, tetraisopropoxytitanium, tetrabutoxytitanium, methyltriethoxysilane, methyltrimethoxysilane, phenyltriethoxysilane and phenyltrimethoxysilane.

6. The method of claim 1, wherein the photosensitive composition contains the hydrolyzable metal or silicon alkoxide in an amount of 1 to 50 parts by weight based on 100 parts by weight of the allyl group-containing metal or silicon alkoxide.

7. The method of claim 1, wherein the photosensitive composition further contains a photoreaction initiator in a proportion of 0.001 to 0.2 moles per mole of the allyl group-containing metal or silicon alkoxide.

8. The method of claim 1, wherein the photosensitive composition further contains a polymerization promoter in a proportion of 0.0005 to 0.1 mole per mole of the total of the metal or silicon alkoxide and the allyl group-containing metal or silicon alkoxide.

9. The method of claim 1, wherein the photosensitive composition further contains water in a molar proportion which is 1 to 20 times as much as the total of the hydrolyzable metal or silicon alkoxide and the allyl group-containing metal or silicon alkoxide having photosensitivity.

10. The method of claim 1, wherein the photosensitive composition contains 5 to 95.49% by weight of the allyl group-containing metal or silicon alkoxide, 1 to 50% by weight of the hydrolyzable metal or silicon alkoxide, 0.5 to 10% by weight of the photoreaction initiator, 0.01 to 10% by weight of the polymerization promoter, 0 to 50% by weight of a solvent and 3 to 50% by weight of water.

11. A method for producing a pattern film-coated article which comprises the steps of coating a photosensitive composition containing an allyl group-containing trialkoxysilane on a substrate, irradiating the coated film on the substrate with light to polymerize the exposed portions of the coated film and then dissolving unexposed portions, of the coated film to remove them.

12. The method of claim 11, wherein the allyl group-containing trialkoxysilane is allyltrimethoxysilane or allyltriethoxysilane.

13. The method of claim 11, wherein the photosensitive composition further contains a photoreaction initiator in a proportion of 0.001 to 0.2 moles per mole of the allyl group-containing trialkoxysilane.

14. The method of claim 11, wherein the photosensitive composition further contains a polymerization promoter in a proportion of 0.0005 to 0.1 mole per mole of the allyl group-containing trialkoxysilane.

15. The method of claim 11, wherein the photosensitive composition further contains water in a molar proportion which is 1 to 20 times as much as the allyl group-containing trialkoxysilane.

16. The method of claim 11, wherein the photosensitive composition contains 5 to 96.49% by weight of the allyl group-containing trialkoxysilane, 0.5 to 10% by weight of the photoreaction initiator, 0.01 to 10% by weight of the polymerization promoter, 0 to 50% by weight of a solvent and 3 to 50% by weight of water.

17. The method of claim 1, wherein the pattern film-coated article is an optical waveguide, diffraction grating or microlens.

18. A photosensitive composition comprising an allyl group-containing metal or silicon alkoxide, a photoreaction initiator, a polymerization promoter and water as main components.

19. The photosensitive composition of claim 18, which further contains a hydrolyzable metal or silicon alkoxide.

20. The photosensitive composition of claim 19, wherein the hydrolyzable metal or silicon alkoxide includes a silicon alkoxide, a titanium alkoxide, a zirconium alkoxide or an aluminum alkoxide.

21. The photosensitive composition of claims 19, wherein the hydrolyzable metal alkoxide includes a silicon tetra- or tri-alkoxide, a titanium tetra- or tri-alkoxide, a zirconium tetra- or tri-alkoxide or an aluminum trialkoxide.

22. The photosensitive composition of claims 19, wherein the hydrolyzable metal or silicon alkoxide includes at least one alkoxide selected from the group consisting of tetraethoxysilane, tetramethoxysilane, tributoxyaluminum, tetrapropoxyzirconium, tetrabutoxyzirconium, tetraisopropoxytitanium, tetrabutoxytitanium, methyltriethoxysilane, methyltrimethoxysilane, phenyltriethoxysilane and phenyltrimethoxysilane.

23. The photosensitive composition of claim 18, wherein the allyl group-containing metal or silicon alkoxide is allyltrialkoxysilane.

24. The photosensitive composition of claim 23, wherein the allyltrialkoxysilane is allyltrimethoxysilane or allyltriethoxysilane.

25. The composition of claim 23, wherein the photosensitive composition contains 5 to 96.49% by weight of allyltrialkoxysilane, 0.5 to 10% by weight of the photoreaction initiator, 0.01 to 10% by weight of the polymerization promoter, 0 to 50% by weight of a solvent and 3 to 30% by weight of water.

26. The composition of claim 18, wherein the photosensitive composition contains 5 to 95.49% by weight of the allyl group-containing metal or silicon alkoxide, 1 to 50% by weight of the hydrolyzable metal or silicon alkoxide, 0.5 to 10% by weight of the photoreaction initiator, 0.01 to 10% by weight of the polymerization promoter, 0 to 50% by weight of a solvent and 3 to 50% by weight of water.

27. The composition of claim 18, wherein the photosensitive composition further contains an acid catalyst in an amount of 0.00002 to 10% by weight.

28. The method of claim 2, wherein the hydrolyzable metal or silicon alkoxide includes a silicon alkoxide, a titanium alkoxide, a zirconium alkoxide or an aluminum alkoxide.

29. The method of claim 2, wherein the hydrolyzable metal or silicon alkoxide includes a silicon tetra- or tri-alkoxide, a titanium tetra- or tri-alkoxide, a zirconium tetra- or tri-alkoxide or an aluminum trialkoxide.

30. The method of claim 3, wherein the hydrolyzable metal or silicon alkoxide includes a silicon tetra- or tri-alkaxide, a titanium tetra- or tri-alkoxide, a zirconium tetra- or tri-alkoxide or an aluminum trialkoxide.

31. The method of claim 2, wherein the hydrolyzable metal or silicon alkoxide includes at least one alkoxide selected from the group consisting of tetraethoxysilane, tetramethoxysilane, tributoxyaluminum, tetrapropoxyzirconium, tetrabutoxyzirconium, tetraisopropoxytitanium, tetrabutoxytitanium, methyltriethoxysilane, methyltrimethoxysilane, phenyltriethoxysilane and phenyltrimethoxysilane.

32. The method of claim 3, wherein the hydrolyzable metal or silicon alkoxide includes at least one alkoxide selected from the group consisting of tetraethoxysilane, tetramethoxysilane, tributoxyaluminum, tetrapropoxyzirconium, tetrabutoxyzirconium, tetraisopropoxytitanium, tetrabutoxytitanium, methyltriethoxysilane, methyltrimethoxysilane, phenyltriethoxysilane and phenyltrimethoxysilane.

33. The method of claim 4, wherein the hydrolyzable metal or silicon alkoxide includes at least one alkoxide selected from the group consisting of tetraethoxysilane, tetramethoxysilane, tributoxyaluminum, tetrapropoxyzirconium, tetrabutoxyzirconium, tetraisopropoxytitanium, tetrabutoxytitanium, methyltriethoxysilane, methyltrimethoxysilane, phenyltriethoxysilane and phenyltrimethoxysilane.

34. The method of claim 2, wherein the photosensitive composition contains the hydrolyzable metal or silicon alkoxide in an amount of 1 to 50 parts by weight based on 100 parts by weight of the allyl group-containing metal or silicon alkoxide.

35. The method of claim 3, wherein the photosensitive composition contains the hydrolyzable metal or silicon alkoxide in an amount of 1 to 50 parts by weight based on 100 parts by weight of the allyl group-containing metal or silicon alkoxide.

36. The method of claim 4, wherein the photosensitive composition contains the hydrolyzable metal or silicon alkoxide in an amount of 1 to 50 parts by weight based on 100 parts by weight of the allyl group-containing metal or silicon alkoxide.

37. The method of claim 5, wherein the photosensitive composition contains the hydrolyzable metal or silicon alkoxide in an amount of 1 to 50 parts by weight based on 100 parts by weight of the allyl group-containing metal or silicon alkoxide.

38. The method of claim 2, wherein the photosensitive composition further contains a photoreaction initiator in a proportion of 0.001 to 0.2 moles per mole of the allyl group-containing metal or silicon alkoxide.

39. The method of claim 3, wherein the photosensitive composition further contains a photoreaction initiator in a proportion of 0.001 to 0.2 moles per mole of the allyl group-containing metal or silicon alkoxide.

40. The method of claim 4, wherein the photosensitive composition further contains a photoreaction initiator in a proportion of 0.001 to 0.2 moles per mole of the allyl group-containing metal or silicon alkoxide.

41. The method of claim 5, wherein the photosensitive composition further contains a photoreaction initiator in a proportion of 0.001 to 0.2 moles per mole of the allyl group-containing metal or silicon alkoxide.

42. The method of claim 6, wherein the photosensitive composition further contains a photoreaction initiator in a proportion of 0.001 to 0.2 moles per mole of the allyl group-containing metal or silicon alkoxide.

43. The method of claim 2, wherein the photosensitive composition further contains a polymerization promoter in a proportion of 0.0005 to 0.1 mole per mole of the total of the metal or silicon alkoxide and the allyl group-containing metal or silicon alkoxide.

44. The method of claim 3, wherein the photosensitive composition further contains a polymerization promoter in a proportion of 0.0005 to 0.1 mole per mole of the total of the metal or silicon alkoxide and the allyl group-containing metal or silicon alkoxide.

45. The method of claim 4, wherein the photosensitive composition further contains a polymerization promoter in a proportion of 0.0005 to 0.1 mole per mole of the total of the metal or silicon alkoxide and the allyl group-containing metal or silicon alkoxide.

46. The method of claim 5, wherein the photosensitive composition further contains a polymerization promoter in a proportion of 0.0005 to 0.1 mole per mole of the total of the metal or silicon alkoxide and the ally group-containing metal or silicon alkoxide.

47. The method of claim 6, wherein the photosensitive composition further contains a polymerization promoter in a proportion of 0.0005 to 0.1 mole per mole of the total of the metal or silicon alkoxide and the allyl group-containing metal or silicon alkoxide.

48. The method of claim 7, wherein the photosensitive composition further contains a polymerization promoter in a proportion of 0.0005 to 0.1 mole per mole of the total of the metal or silicon alkoxide and the allyl group-containing metal or silicon alkoxide.

49. The method of claim 2, wherein the photosensitive composition further contains water in a molar proportion which is 1 to 20 times as much as the total of the hydrolyzable metal or silicon alkoxide and the allyl group-containing metal or silicon alkoxide having photosensitivity.

50. The method of claim 3, wherein the photosensitive composition further contains water in a molar proportion which is 1 to 20 times as much as the total of the hydrolyzable metal or silicon alkoxide and the allyl group-containing metal or silicon alkoxide having photosensitivity.

51. The method of claim 4, wherein the photosensitive composition further contains water in a molar proportion which is 1 to 20 times as much as the total of the hydrolyzable metal or silicon alkoxide and the allyl group-containing metal or silicon alkoxide having photosensitivity.

52. The method of claim 5, wherein the photosensitive composition further contains water in a molar proportion which is 1 to 20 times as much as the total of the hydrolyzable metal or silicon alkoxide and the allyl group-containing metal or silicon alkoxide having photosensitivity.

53. The method of claim 6, wherein the photosensitive composition further contains water in a molar proportion which is 1 to 20 times as much as the total of the hydrolyzable metal or silicon alkoxide and the allyl group-containing metal or silicon alkoxide having photosensitivity.

54. The method of claim 7, wherein the photosensitive composition further contains water in a molar proportion which is 1 to 20 times as much as the total of the hydrolyzable metal or silicon alkoxide and the allyl group-containing metal or silicon alkoxide having photosensitivity.

55. The method of claim 8, wherein the photosensitive composition further contains water in a molar proportion which is 1 to 20 times as much as the total of the hydrolyzable metal or silicon alkoxide and the allyl group-containing metal or silicon alkoxide having photosensitivity.

56. The method of claim 2, wherein the photosensitive composition contains 5 to 95.49% by weight of the allyl group-containing metal or silicon alkoxide, 1 to 50% by weight of the hydrolyzable metal or silicon alkoxide, 0.5 to 10% by weight of the photoreaction initiator, 0.01 to 10% by weight of the polymerization promoter, 0 to 50% by weight of a solvent and 3 to 50% by weight of water.

57. The method of claim 3, wherein the photosensitive composition contains 5 to 95.49% by weight of the allyl group-containing metal or silicon alkoxide, 1 to 50% by weight of the hydrolyzable metal or silicon alkoxide, 0.5 to 10% by weight of the photoreaction initiator, 0.01 to 10% by weight of the polymerization promoter, 0 to 50% by weight of a solvent and 3 to 50% by weight of water.

58. The method of claim 4, wherein the photosensitive composition contains 5 to 95.49% by weight of the allyl group-containing metal or silicon alkoxide, 1 to 50% by weight of the hydrolyzable metal or silicon alkoxide, 0.5 to 10% by weight of the photoreaction initiator, 0.01 to 10% by weight of the polymerization promoter, 0 to 50% by weight of a solvent and 3 to 50% by weight of water.

59. The method of claim 5, wherein the photosensitive composition contains 5 to 95.49% by weight of the allyl group-containing metal or silicon alkoxide, 1 to 50% by weight of the hydrolyzable metal or silicon alkoxide, 0.5 to 10% by weight of the photoreaction initiator, 0.01 to 10% by weight of the polymerization promoter, 0 to 50% by weight of a solvent and 3 to 50% by weight of water.

60. The method of claim 6, wherein the photosensitive composition contains 5 to 95.49% by weight of the allyl group-containing metal or silicon alkoxide, 1 to 50% by weight of the hydrolyzable metal or silicon alkoxide, 0.5 to 10% by weight of the photoreaction initiator, 0.01 to 10% by weight of the polymerization promoter, 0 to 50% by weight of a solvent and 3 to 50% by weight of water.

61. The method of claim 7, wherein the photosensitive composition contains 5 to 95.49% by weight of the allyl group-containing metal or silicon alkoxide, 1 to 50% by weight of the hydrolyzable metal or silicon alkoxide, 0.5 to 10% by weight of the photoreaction initiator, 0.01 to 10% by weight of the polymerization promoter, 0 to 50% by weight of a solvent and 3 to 50% by weight of water.

62. The method of claim 8, wherein the photosensitive composition contains 5 to 95.49% by weight of the allyl group-containing metal or silicon alkoxide, 1 to 50% by weight of the hydrolyzable metal or silicon alkoxide, 0.5 to 10% by weight of the photoreaction initiator, 0.01 to 10% by weight of the polymerization promoter, 0 to 50% by weight of a solvent and 3 to 50% by weight of water.

63. The method of claim 9, wherein the photosensitive composition contains 5 to 95.49% by weight of the allyl group-containing metal or silicon alkoxide, 1 to 50% by weight of the hydrolyzable metal or silicon alkoxide, 0.5 to 10% by weight of the photoreaction initiator, 0.01 to 10% by weight of the polymerization promoter, 0 to 50% by weight of a solvent and 3 to 50% by weight of water.

64. The method of claim 12, wherein the photosensitive composition further contains a photoreaction initiator in a proportion of 0.001 to 0.2 moles per mole of the allyl group-containing trialkoxysilane.

65. The method of claim 12, wherein the photosensitive composition further contains a polymerization promoter in a proportion of 0.0005 to 0.1 mole per mole of the allyl group-containing trialkoxysilane.

66. The method of claim 13, wherein the photosensitive composition further contains a polymerization promoter in a proportion of 0.0005 to 0.1 mole per mole of the allyl group-containing trialkoxysilane.

67. The method of claim 12, wherein the photosensitive composition further contains water in a molar proportion which is 1 to 20 times as much as the allyl group-containing trialkoxysilane.

68. The method of claim 13, wherein the photosensitive composition further contains water in a molar proportion which is 1 to 20 times as much as the allyl group-containing trialkoxysilane.

69. The method of claim 14, wherein the photosensitive composition further contains water in a molar proportion which is 1 to 20 times as much as the allyl group-containing trialkoxysilane.

70. The method of claim 12, wherein the photosensitive composition contains 5 to 96.49% by weight of the allyl group-containing trialkoxysilane, 0.5 to 10% by weight of the photoreaction initiator, 0.01 to 10% by weight of the polymerization promoter, 0 to 50% by weight of a solvent and 3 to 50% by weight of water.

71. The method of claim 13, wherein the photosensitive composition contains 5 to 96.49% by weight of the allyl group-containing trialkoxysilane, 0.5 to 10% by weight of the photoreaction initiator, 0.01 to 10% by weight of the polymerization promoter, 0 to 50% by weight of a solvent and 3 to 50% by weight of water.

72. The method of claim 14, wherein the photosensitive composition contains 5 to 96.49% by weight of the allyl group-containing trialkoxysilane, 0.5 to 10% by weight of the photoreaction initiator, 0.01 to 10% by weight of the polymerization promoter, 0 to 50% by weight of a solvent and 3 to 50% by weight of water.

73. The method of claim 15, wherein the photosensitive composition contains 5 to 96.49% by weight of the allyl group-containing trialkoxysilane, 0.5 to 10% by weight of the photoreaction initiator, 0.01 to 10% by weight of the polymerization promoter, 0 to 50% by weight of a solvent and 3 to 50% by weight of water.

74. The method of claim 2, wherein the pattern film-coated article is an optical waveguide, diffraction grating or microlens.

75. The method of claim 3, wherein the pattern film-coated article is an optical waveguide, diffraction grating or microlens.

76. The method of claim 4, wherein the pattern film-coated article is an optical waveguide, diffraction grating or microlens.

77. The method of claim 5, wherein the pattern film-coated article is an optical waveguide, diffraction grating or microlens.

78. The method of claim 6, wherein the pattern film-coated article is an optical waveguide, diffraction grating or microlens.

79. The method of claim 7, wherein the pattern film-coated article is an optical waveguide, diffraction grating or microlens.

80. The method of claim 8, wherein the pattern film-coated article is an optical waveguide, diffraction grating or microlens.

81. The method of claim 9, wherein the pattern film-coated article is an optical waveguide, diffraction grating or microlens.

82. The method of claim 10, wherein the pattern film-coated article is an optical waveguide, diffraction grating or microlens.

83. The method of claim 11, wherein the pattern film-coated article is an optical waveguide, diffraction grating or microlens.

84. The method of claim 12, wherein the pattern film-coated article is an optical waveguide, diffraction grating or microlens.

85. The method of claim 13, wherein the pattern film-coated article is an optical waveguide, diffraction grating or microlens.

86. The method of claim 14, wherein the pattern film-coated article is an optical waveguide, diffraction grating or microlens.

87. The method of claim 15, wherein the pattern film-coated article is an optical waveguide, diffraction grating or microlens.

88. The method of claim 16, wherein the pattern film-coated article is an optical waveguide, diffraction grating or microlens.

89. The photosensitive composition of claim 19, wherein the allyl group-containing metal or silicon alkoxide is allyl-trialkoxysilane.

90. The photosensitive composition of claim 20, wherein the allyl group-containing metal or silicon alkoxide is allyl-trialkoxysilane.

91. The photosensitive composition of claim 21, wherein the allyl group-containing metal or silicon alkoxide is allyl-trialkoxysilane.

92. The photosensitive composition of claim 22, wherein the allyl group-containing metal or silicon alkoxide is allyl-trialkoxysilane.

93. The composition of claim 19, wherein the photosensitive composition contains 5 to 95.49% by weight of the ally group-containing metal or silicon alkoxide, 1 to 50% by weight of the hydrolyzable metal or silicon alkoxide, 0.5 to 10% by weight of the photoreaction initiator, 0.01 to 10% by weight of the polymerization promoter, 0 to 50% by weight of a solvent and 3 to 50% by weight of water.

94. The composition of claim 20, wherein the photosensitive composition contains 5 to 95.49% by weight of the allyl group-containing metal or silicon alkoxide, 1 to 50% by weight of the hydrolyzable metal or silicon alkoxide, 0.5 to 10% by weight of the photoreaction initiator, 0.01 to 10% by weight of the polymerization promoter, 0 to 50% by weight of a solvent and 3 to 50% by weight of water.

95. The composition of claim 21, wherein the photosensitive composition contains 5 to 95.49% by weight of the allyl group-containing metal or silicon alkoxide, 1 to 50% by weight of the hydrolyzable metal or silicon alkoxide, 0.5 to 10% by weight of the photoreaction initiator, 0.01 to 10% by weight of the polymerization promoter, 0 to 50% by weight of a solvent and 3 to 50% by weight of water.

96. The composition of claim 22, wherein the photosensitive composition contains 5 to 95.49% by weight of the ally group-containing metal or silicon alkoxide, 1 to 50% by weight of the hydrolyzable metal or silicon alkoxide, 0.5 to 10% by weight of the photoreaction initiator, 0.01 to 10% by weight of the polymerization promoter, 0 to 50% by weight of a solvent and 3 to 50% by weight of water.

97. The composition of claim 23, wherein the photosensitive composition contains 5 to 95.49% by weight of the allyl group-containing metal or silicon alkoxide, 1 to 50% by weight of the hydrolyzable metal or silicon alkoxide, 0.5 to 10% by weight of the photoreaction initiator, 0.01 to 10% by weight of the polymerization promoter, 0 to 50% by weight of a solvent and 3 to 50% by weight of water.

98. The composition of claim 24, wherein the photosensitive composition contains 5 to 95.49% by weight of the allyl group-containing metal or silicon alkoxide, 1 to 50% by weight of the hydrolyzable metal or silicon alkoxide, 0.5 to 10% by weight of the photoreaction initiator, 0.01 to 10% by weight of the polymerization promoter, 0 to 50% by weight of a solvent and 3 to 50% by weight of water.

99. The composition of claim 19, wherein the photosensitive composition further contains an acid catalyst in an amount of 0.00002 to 10% by weight.

100. The composition of claim 20, wherein the photosensitive composition further contains an acid catalyst in an amount of 0.00002 to 10% by weight.

101. The composition of claim 21, wherein the photosensitive composition further contains an acid catalyst in an amount of 0.00002 to 10% by weight.

102. The composition of claim 22, wherein the photosensitive composition further contains an acid catalyst in an amount of 0.00002 to 10% by weight.

103. The composition of claim 23, wherein the photosensitive composition further contains an acid catalyst in an amount of 0.00002 to 10% by weight.

104. The composition of claim 24, wherein the photosensitive composition further contains an acid catalyst in an amount of 0.00002 to 10% by weight.

105. The composition of claim 25, wherein the photosensitive composition further contains an acid catalyst in an amount of 0.00002 to 10% by weight.

106. The composition of claim 26, wherein the photosensitive composition further contains an acid catalyst in an amount of 0.00002 to 10% by weight.

* * * * *